US006943375B2

(12) United States Patent
Yang

(10) Patent No.: US 6,943,375 B2
(45) Date of Patent: Sep. 13, 2005

(54) CAPACITOR IN A PIXEL STRUCTURE

(75) Inventor: Chien-Sheng Yang, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 10/692,838

(22) Filed: Oct. 23, 2003

(65) Prior Publication Data

US 2004/0079946 A1 Apr. 29, 2004

(30) Foreign Application Priority Data

Oct. 25, 2002 (TW) ....................................... 91125102 A

(51) Int. Cl.[7] ................................................ H01L 29/15
(52) U.S. Cl. ............................ 257/72; 257/59; 257/532
(58) Field of Search ............................. 257/59, 72, 532

(56) References Cited

U.S. PATENT DOCUMENTS 6,777,709 B2 * 8/2004 Wu et al. ..................... 257/59
6,797,961 B2 * 9/2004 Choo et al. ............ 250/370.09

* cited by examiner

*Primary Examiner*—David Zarneke
*Assistant Examiner*—Douglas M. Menz
(74) *Attorney, Agent, or Firm*—J.C. Patents

(57) ABSTRACT

A capacitor in a pixel structure deposited under a pixel electrode comprises a top electrode, a bottom electrode, and a dielectric layer between the top electrode and the bottom electrode. The top electrode comprises a coupling part and a protruding part, wherein the coupling part corresponds to the bottom electrode for forming a coupling region between the coupling part and the bottom electrode, and the protruding part exceeds the coupling region. Furthermore, a passivation layer covers the top electrode, and an opening formed in the passivation layer exposes the protruding part of the top electrode. The pixel electrode is on the passivation layer and electrically connects with the top electrode through the opening.

5 Claims, 2 Drawing Sheets

CAPACITOR IN A PIXEL STRUCTURE

CROSS-REFERENCE TO RELATED APPLICATION

This application claims the priority benefit of Taiwan application Ser. No. 91125102, filed on Oct. 25, 2002.

BACKGROUND OF THE INVENTION

1. Field of Invention

The present invention generally relates to a capacitor structure, and more particularly, to a capacitor in a pixel structure used for the Thin Film Transistor-Liquid Crystal Display (abbreviated as TFT-LCD).

2. Description of Related Art

TFT-LCD is mostly composed of a Thin Film Transistor (abbreviated as TFT) element and a Liquid Crystal Display (abbreviated as LCD) element, wherein the TFT element comprises a plurality of TFT that are disposed in a matrix pattern, and each TFT has a pixel electrode. The TFT mentioned above is formed by stacking the gate, channel layer, source/drain layer on a substrate, and the TFT is used as a switching element for the LCD element.

The operation principle of the TFT element is similar to the operation principle of the traditional semiconductor MOS element, both of them having three electrodes (gate, source and drain). The TFT element is typically categorized into two different types, one is made of the amorphous-silicon (a-Si) material and the other is made of the polysilicon material, and the technique of the a-Si TFT is more matured. The pixel capacitor is generally formed in the process of making the TFT and pixel electrode, so as to control the brightness status of the pixel.

FIG. 1 schematically shows a top view of a conventional capacitor in a pixel structure, and FIG. 2 is a sectional sketch map of the portion from I to I' in FIG. 1.

Referring to both FIG. 1 and FIG. 2, the conventional capacitor in a pixel structure formed under the pixel electrode 112 comprises a bottom electrode 102, a top electrode 104, and a dielectric layer 108 between the bottom electrode 102 and the top electrode 104. The method for forming the capacitor in a pixel structure comprises the steps of: first, forming a bottom electrode 102 on a substrate 100; then forming a dielectric layer 108 on the bottom electrode 102; then forming a top electrode 104 on the dielectric layer 108, wherein the formed top electrode 104 corresponds to the bottom electrode 102 so as to form a coupling region between the bottom electrode 102 and the top electrode 104; forming a passivation layer 110 for covering the top electrode 104 and the dielectric layer 104; afterwards, pattering the passivation layer 110 for forming an opening 106 so as to partially expose the top electrode 104; and finally forming a pixel electrode 112 between the passivation layer 110 and the opening 106, so that the pixel electrode 112 electrically couples with the top electrode 104. Since the opening 106 is for coupling the top electrode 104 to the pixel electrode 112, therefore, the opening can be defined as a contact region.

The light spot defect generally occurs when a short circuit happens in the capacitor. However, if the electrode line of the defective capacitor is cut off directly, the other pixels on the same electrode line are also impacted, thus causing the weak line problem. Therefore, the design of the conventional capacitor in a pixel structure cannot effectively fix the defect if it is generated.

SUMMARY OF THE INVENTION

To solve the above problem, the object of the present invention is to provide a capacitor in a pixel structure, so that a fix operation can be performed when a short circuit happens in the capacitor.

A capacitor in a pixel structure deposited under a pixel electrode is provided by the present invention. The capacitor in a pixel structure comprising a top electrode, a bottom electrode, and a dielectric layer between the top electrode and the bottom electrode. The top electrode comprises a coupling part and a protruding part, wherein the coupling part corresponds to the bottom electrode for forming a coupling region between the coupling part and the bottom electrode, and the protruding part exceeds the coupling region. Furthermore, a passivation layer covers the top electrode, and an opening formed in the passivation layer exposes the protruding part of the top electrode. The pixel electrode is on the passivation layer and electrically connects with the top electrode through the opening. The pixel electrode deposited in the upper location between the opening and the coupling region has an incision opening for exposing the passivation layer.

According to the present invention, the opening coupled to the pixel electrode inside the pixel capacitor is moved to outside of the coupling region of the pixel capacitor, so that the opening for electrically contacting with the pixel electrode can be cut off for fixing the problem when a short circuit happens in the capacitor. Therefore, the conventional problem of not being able to fix the light spot defect resulting from the short circuit of the capacitor can be resolved.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DESCRIPTION OF THE PREFERRED EMBODIMENTS

Figure 1:
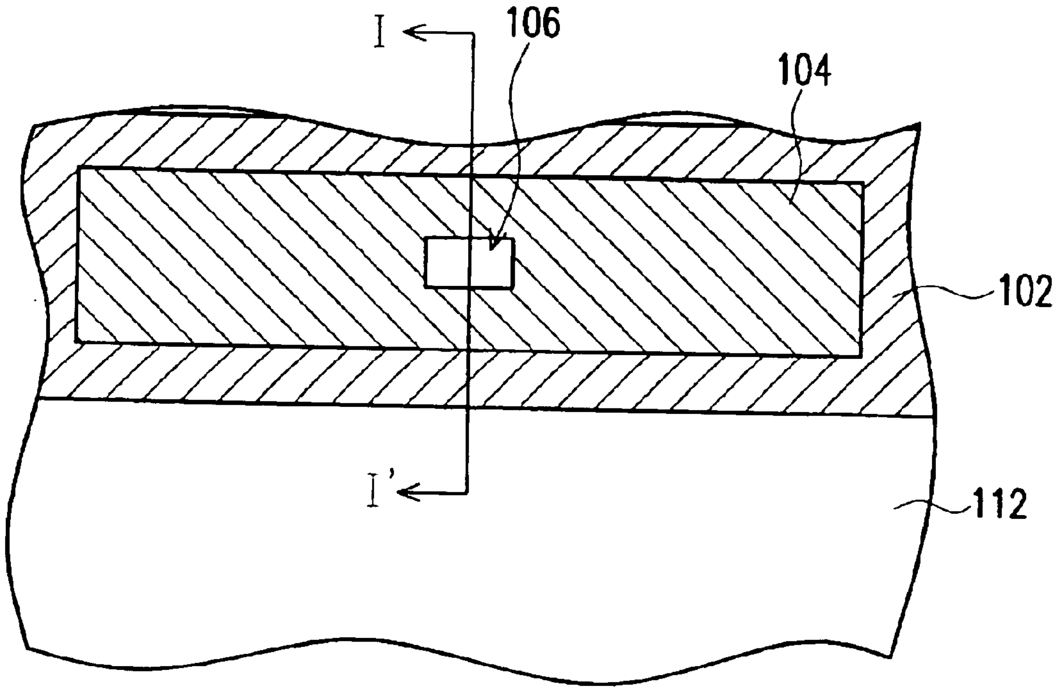
FIG. 1 schematically shows a top view of a conventional capacitor in a pixel structure.
Figure 2:
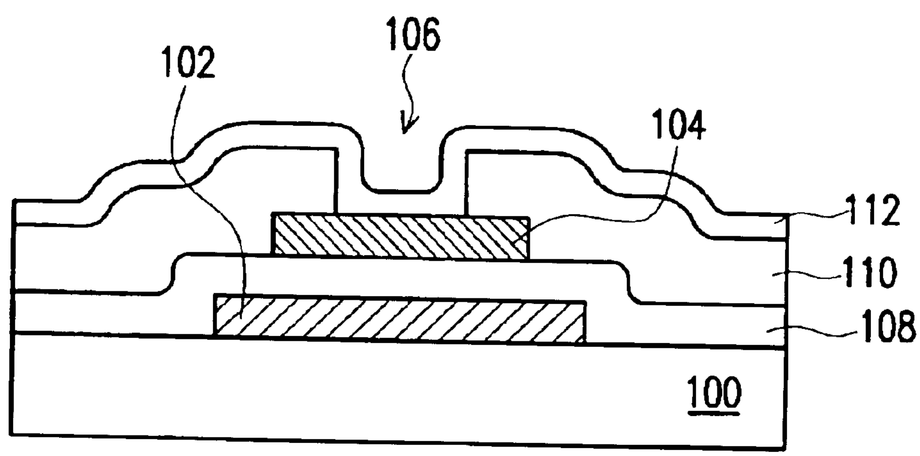
FIG. 2 is a sectional sketch map of the portion from I to I' in FIG. 1.
Figure 3:
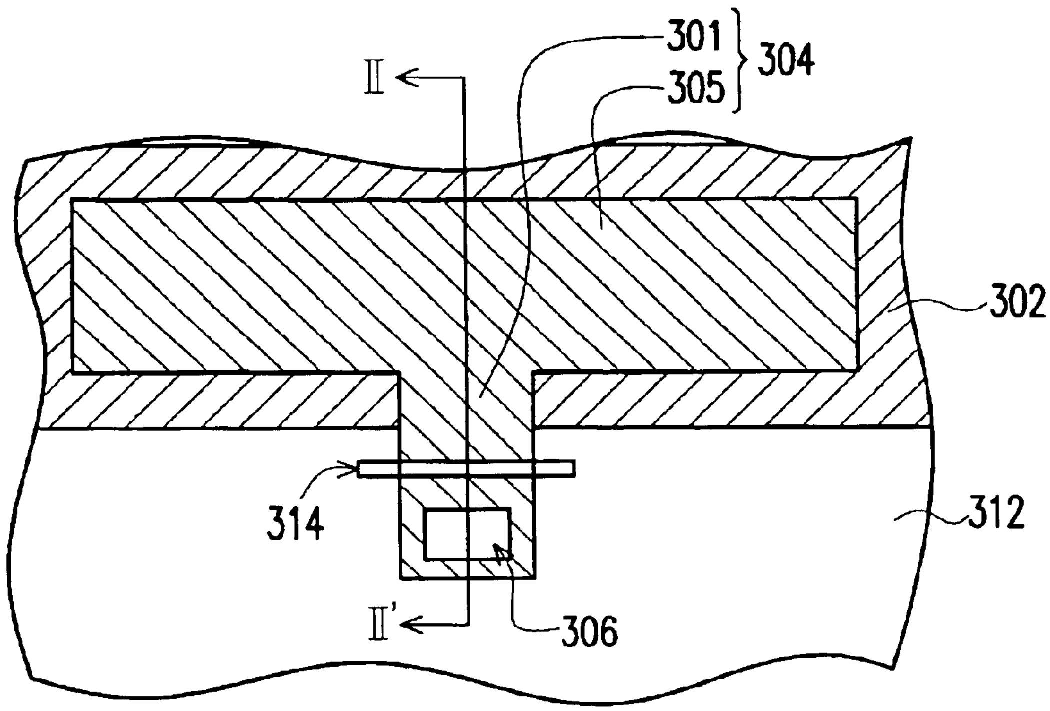
FIG. 3 is a top view of a capacitor in a pixel structure of a preferred embodiment according to the present invention.
Figure 4:
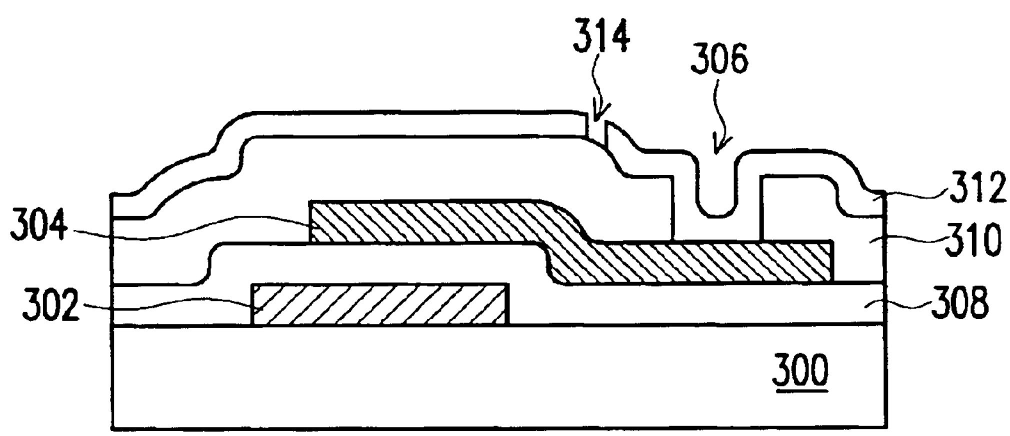
FIG. 4 is a sectional sketch map of the portion from II to II' in FIG. 3.

FIG. 3 is a top view of a capacitor in a pixel structure of a preferred embodiment according to the present invention, and FIG. 4 is a sectional sketch map of the portion from II to II' in FIG. 3.

The capacitor in a pixel structure of the present invention is formed in a pixel (not shown in the diagram) between a gate wiring and a data wiring, and the pixel comprises a TFT, a pixel electrode corresponds to the deposited TFT, and a pixel capacitor under the pixel electrode, wherein the gate of the TFT couples to the gate wiring, the source of the TFT couples to the data wiring, and the drain of the TFT couples to the pixel electrode.

Referring to both FIG. 3 and FIG. 4, the method for producing the pixel capacitor first forms a bottom electrode 302 on a substrate 300, wherein the bottom electrode 302 is made of metal and is formed at the same time as the gate of the TFT. Then, a dielectric layer 308 is formed on the substrate 300 and the bottom electrode 302, wherein the dielectric layer 308 is made of $Si_3N_4$ and is formed at the same time as the gate isolation layer of the TFT. Afterwards, a top electrode 304 is formed on the dielectric layer 308, where the top electrode 304 is made of metal and is formed at the same time as the source and drain of the TFT.

The top electrode 304 formed in the present invention comprises a coupling part 305 and a protruding part 301. The coupling part 305 of the top electrode 304 corresponds to the bottom electrode 302 so as to form a coupling region (capacitor region) between the bottom electrode 302 and the coupling region 305 of the top electrode 304. The protruding part 301 of the top electrode 304 exceeds the bottom electrode 302 and is located outside the coupling region.

Afterwards, a passivation layer 310 is formed on the top electrode 304, wherein the passivation layer 310 is made of $Si_3N_4$ and is formed at the same time when the passivation layer of the TFT is formed. The passivation layer 310 is subsequently patterned to form an opening for exposing part of the top electrode 304. Then, a pixel electrode 312 is formed in the passivation layer 310 and the opening 306, so that the pixel electrode 312 couples to the top electrode 304, wherein the pixel electrode 312 is made of indium tin oxide. Moreover, the opening 306 is used to couple the pixel electrode 312 to the top electrode 304, thus it can be defined as a contact region.

The pixel electrode 312 is subsequently patterned to form an incision opening 314 on the pixel electrode 312 above the protruding part 301 between the opening 306 and the coupling part 305, so as to cut off the opening 306 that is used to electrically connect to the pixel electrode 312.

The protruding part 301 of the of the top electrode 304 in the capacitor in a pixel structure formed according to the present invention exceeds and is outside the coupling area of the pixel capacitor, and the opening 306 for coupling the pixel electrode 312 in the capacitor in a pixel structure is also outside the coupling area. Therefore, the opening 306 for coupling to the pixel electrode 312 can be cut off from the incision opening 314, so that the light spot defect resulting from the short circuit of the capacitor can be fixed when it happens.

The object of the incision opening 314 is to prevent the pixel electrode 312 from merging with the top electrode 304 due to its high temperature and therefore causing the failure of the incision when the laser cutting is performed.

Therefore, since the opening for coupling to the pixel electrode of the capacitor in a pixel structure according to the present invention extends and protrudes onto one side of the electrode line, the opening for coupling to the pixel electrode can be cut off independently without impacting other capacitors jointly coupled to the electrode line. Therefore, it resolves the conventional problem of not being able to fix the light spot defect resulting from the short circuit in the capacitor. Moreover, by reserving an incision opening 314 on the protruding portion, it also effectively prevents the incision failure from happening.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A capacitor structure corresponding to a pixel, comprising:

a bottom electrode, deposited on a substrate;

a dielectric layer, deposited on the bottom electrode;

a top electrode, corresponding to the bottom electrode and deposited on the dielectric layer, wherein the top electrode comprises a coupling part and a protruding part, the coupling part corresponds to the bottom electrode for forming a capacitor region, and the protruding part exceeds the capacitor region;

a passivation layer, covering the top electrode, wherein an opening formed in the passivation layer exposes the protruding part of the top electrode; and a pixel electrode, covering the passivation layer and electrically connecting with the top electrode through the opening, wherein the pixel electrode is patterned to form an incision opening between the opening and the coupling part above the protruding part to expose the passivation layer.

2. The capacitor structure of claim 1, wherein the bottom electrode is made of a metal material.

3. The capacitor structure of claim 1, wherein the top electrode is made of a metal material.

4. The capacitor structure of claim 1, wherein the pixel electrode is made of an indium tin oxide material.

5. The capacitor structure of claim 1, wherein the dielectric layer is made of a $Si_3N_4$ material.

* * * * *